United States Patent
Yanase et al.

(10) Patent No.: US 12,071,704 B2
(45) Date of Patent: Aug. 27, 2024

(54) APPARATUS FOR MANUFACTURING A SINGLE CRYSTAL BY THE CZOCHRALSKI METHOD COMPRISING A COOLING CYLINDER WITH AN AUXILIARY COOLING CYLINDER FITTED INSIDE THE COOLING CYLINDER

(71) Applicant: SHIN-ETSU HANDOTAI CO., LTD., Tokyo (JP)

(72) Inventors: Kazuya Yanase, Nishigo-mura (JP); Atsushi Okai, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 97 days.

(21) Appl. No.: 17/785,583

(22) PCT Filed: Nov. 20, 2020

(86) PCT No.: PCT/JP2020/043303
§ 371 (c)(1),
(2) Date: Jun. 15, 2022

(87) PCT Pub. No.: WO2021/140758
PCT Pub. Date: Jul. 15, 2021

(65) Prior Publication Data
US 2023/0015551 A1    Jan. 19, 2023

(30) Foreign Application Priority Data
Jan. 10, 2020    (JP) ................. 2020-002661

(51) Int. Cl.
*C30B 15/20* (2006.01)
*C30B 15/00* (2006.01)
*C30B 29/06* (2006.01)

(52) U.S. Cl.
CPC ............. *C30B 15/00* (2013.01); *C30B 29/06* (2013.01)

(58) Field of Classification Search
CPC ......... C30B 15/00; C30B 15/14; C30B 15/20; C30B 15/206; C30B 29/00; C30B 29/02; C30B 29/06
(Continued)

(56) References Cited

U.S. PATENT DOCUMENTS

| 4,330,362 A | 5/1982 | Zulehner |
| 6,036,776 A | 3/2000 | Kotooka et al. |

(Continued)

FOREIGN PATENT DOCUMENTS

| CN | 208562590 U | * | 3/2019 |
| DE | 11 2013 001 054 T5 | | 12/2014 |

(Continued)

OTHER PUBLICATIONS

Jun. 23, 2020 Office Action issued in Japanese Patent Application No. 2020-002661.
(Continued)

*Primary Examiner* — Kenneth A Bratland, Jr.
(74) *Attorney, Agent, or Firm* — Oliff PLC (57) ABSTRACT

An apparatus for manufacturing a single crystal by growing a single crystal according to a Czochralski method, the apparatus including: main chamber configured to house crucible configured to accommodate raw-material melt, and heater configured to heat raw-material melt; pulling chamber continuously provided at upper portion of main chamber and configured to accommodate single crystal grown and pulled; cooling cylinder extending from at least ceiling portion of main chamber toward raw-material melt so as to surround single crystal being pulled, cooling cylinder configured to be forcibly cooled with coolant; and auxiliary cooling cylinder (Continued)

fitted in an inside of cooling cylinder. Auxiliary cooling cylinder is made of any one or more materials of graphite, carbon composite, stainless steel, molybdenum, and tungsten. The auxiliary cooling cylinder has structure covering bottom surface of cooling cylinder facing raw-material melt. Gap between auxiliary cooling cylinder and bottom surface of cooling cylinder is 1.0 mm or less.

4 Claims, 4 Drawing Sheets

(58) Field of Classification Search
USPC .............. 117/200, 204, 206, 208, 217, 928, 117/931–932
See application file for complete search history.

(56) References Cited

U.S. PATENT DOCUMENTS

| | | | |
|---|---|---|---|
| 6,048,395 | A | 4/2000 | Iida et al. |
| 2003/0070605 | A1 | 4/2003 | Hoshi et al. |
| 2010/0258050 | A1* | 10/2010 | Hoshi ............... C30B 15/20 117/217 |
| 2015/0020728 | A1 | 1/2015 | Hoshi et al. |
| 2015/0240380 | A1 | 8/2015 | Hoshi et al. |

FOREIGN PATENT DOCUMENTS

| | | |
|---|---|---|
| DE | 11 2013 003 894 T5 | 4/2015 |
| JP | S57-040119 B2 | 8/1982 |
| JP | S64-065086 A | 3/1989 |
| JP | H06-199590 A | 7/1994 |
| JP | H08-081294 A | 3/1996 |
| JP | H11-092272 A | 4/1999 |
| JP | H11-157996 A | 6/1999 |
| JP | 2002-068887 A | 3/2002 |
| JP | 2009-161416 A | 7/2009 |
| JP | 2013-193897 A | 9/2013 |
| WO | 01/057293 A1 | 8/2001 |

OTHER PUBLICATIONS

Sep. 29, 2020 Office Action issued in Japanese Patent Application No. 2020-002661.
Jan. 19, 2021 International Search Report issued in International Patent Application No. PCT/JP2020/043303.
Jul. 12, 2022 International Preliminary Report on Patentability issued in International Patent Application No. PCT/JP2020/043303.
Feb. 27, 2024 Office Action issued in German Application No. 11 2020 006 483.2.
Mar. 25, 2024 Office Action issued in Korean Patent Application No. 10-2022-7022401.
May 27, 2024 Office Action issued in Chinese Patent Application No. 202080091664.7.

* cited by examiner

APPARATUS FOR MANUFACTURING A SINGLE CRYSTAL BY THE CZOCHRALSKI METHOD COMPRISING A COOLING CYLINDER WITH AN AUXILIARY COOLING CYLINDER FITTED INSIDE THE COOLING CYLINDER

TECHNICAL FIELD

The present invention relates to an apparatus for manufacturing a silicon single crystal or the like according to a Czochralski method.

BACKGROUND ART

Semiconductors, such as silicon and gallium arsenide, are constituted of single crystals and utilized for memories of small to large computers, for example. Meanwhile, there are demands for storage devices having larger capacity, lower cost, and higher quality.

Conventionally, as one of single-crystal manufacturing methods for manufacturing a single crystal to satisfy these demands for semiconductors, a method (generally referred to as Czochralski method (CZ method)) is known in which a seed crystal is dipped into a semiconductor raw material in a molten state accommodated in a crucible and then pulled up, so that a semiconductor with large diameter and high quality is manufactured.

Figure 7:
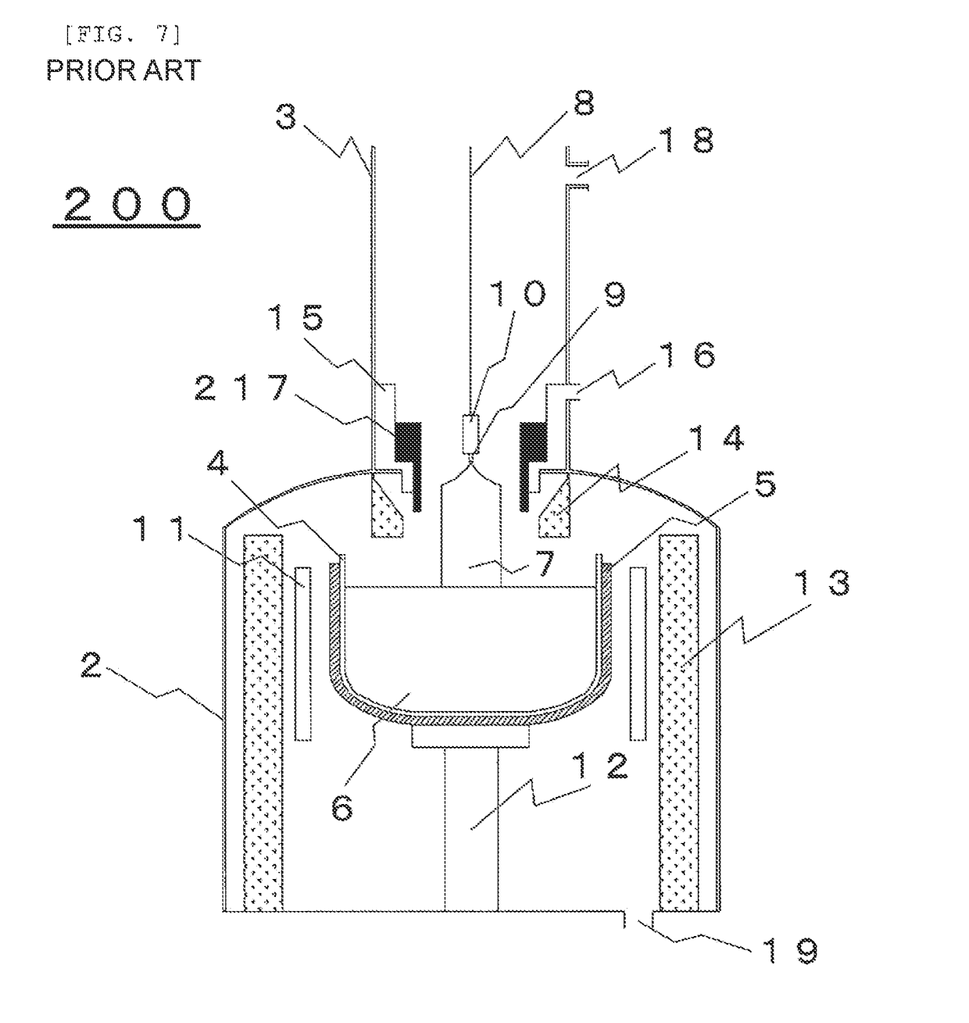
FIG. 7 is a schematic cross-sectional view showing an example of a conventional apparatus for manufacturing a single crystal according to a CZ method.

Hereinafter, a conventional apparatus for manufacturing a single crystal according to a. CZ method will be described by exemplifying growth of a silicon single crystal. FIG. 7 shows a schematic cross-sectional view of an exemplary conventional apparatus for manufacturing a single crystal. In an apparatus 200 for manufacturing a single crystal (conventional example) used in the production of a silicon single crystal according to a CZ method, a quartz crucible 4, a graphite crucible 5, and a heater 11 are generally provided in a main chamber 2 where a single crystal is grown. The quartz crucible 4 and the graphite crucible 5 accommodate a raw-material melt 6 and can move upwardly and downwardly. The heater 11 is provided so as to surround the quartz crucible 4 and the graphite crucible 5. A pulling chamber 3 for accommodating and taking out the grown single crystal is continuously provided to an upper portion of the main chamber 2. Moreover, a heat insulating member 13 is provided between the main chamber 2 and the heater 11. Further, a heat shielding member 14 is provided between the pulling chamber 3 and the raw-material melt 6. The heat shielding member 14 extends downward from a ceiling portion of the main chamber 2.

When a single crystal is manufactured using such an apparatus 200 for manufacturing a single crystal, a seed crystal 9 is immersed in the raw-material melt 6 and carefully pulled upward while the seed crystal 9 and the crucible rotation shaft 12 are being rotated to grow the single crystal in the form of rod. Meanwhile, the quartz crucible 4 and the graphite crucible 5 are elevated according to the crystal growth so as to maintain the melt surface at a constant height all the time so that desired diameter and crystal quality are obtained.

Moreover, when the single crystal is grown, the seed crystal 9 attached to a seed crystal holder 10 is immersed in the raw-material melt 6, and then a wire 8 is carefully wound up while the seed crystal 9 is being rotated in a desired direction with a pulling mechanism (not shown) to grow the single crystal 7 at a tip end portion of the seed crystal 9. Here, in order to eliminate dislocations generated when the seed crystal 9 is brought into contact with the raw-material melt 6, the crystal is once narrowed to a diameter of about 3 to 5 mm in an early stage of the growth. After the dislocations are eliminated, the diameter is increased up to a desired diameter so as to grow the single crystal 7 as desired.

However, this method results in insufficient strength to support the single crystal 7 having higher weight in accordance with the recent trend in diameter enlargement of the single crystal 7. For example, if the diameter is narrowed to 5 mm, the highest weight of the single crystal 7 that can be pulled is considered to be about 250 kg in view of safety. Hence, recently, the tip end portion of the seed crystal 9 is formed into tapered shape so as to reduce the heat capacity of the tip end portion of the seed crystal 9, which comes into contact with the raw-material melt 6. Thereby, quite a small number of dislocations are generated instantaneously when the seed crystal 9 comes into contact with the raw-material melt 6. Consequently, the necking-free single crystal 7 is virtually grown.

In this case, a pulling rate for a constant-diameter portion having an unchanged diameter of the single crystal 7, although depending on the diameter of the single crystal to be pulled, is about 0.4 to 2.0 mm/min and extremely slow. If it is pulled fast by constraint, the single crystal 7 is deformed during the growth and consequently a columnar product having a uniform diameter can be no longer obtained. Otherwise, there arise problems, for example: slip dislocations are generated in the single crystal 7; or the single crystal 7 cannot be a product by being detached from the raw-material melt. Thus, increasing the crystal growth rate is limited.

Nevertheless, for the purpose of improving productivity and reducing cost in the foregoing conventional production of the single crystal 7 according to the CZ method, increasing the growth rate of the single crystal 7 is one major approach. Accordingly, various improvements have hitherto been made in order to achieve the increase in the growth rate of the single crystal 7.

It is known that the growth rate of the single crystal 7 is determined by heat balance of the single crystal 7 during the growth and can be increased by efficiently removing the heat emitted from a surface of the single crystal 7. This means that an enhancement of a cooling effect on the single crystal 7 enables further efficient single crystal production.

Furthermore, it is known that crystal quality varies with a cooling speed of the single crystal 7. For example, Grown-in defects formed in the silicon single crystal during the growth of the single crystal can be controlled by a ratio between a temperature gradient in the crystal and the pulling rate (growth rate) of the single crystal, and a defect-free single crystal can be grown by controlling the ratio (see Patent document 1).

Thus, the enhancement of the cooling effect on the single crystal during the growth is important in manufacturing defect-free crystal and also in improving the productivity by increasing the growth rate of the single crystal.

In order to efficiently cool the single crystal 7 in the CZ method, there is an effective method in which radiant heat from the single crystal 7 is absorbed into a forcibly-cooled object such as chamber without directly exposing the crystal to radiation from the heater 11. An apparatus structure that can realize this is screen structure (see Patent document 2).

However, in this structure, if the screen is structured to avoid contact with upper ends of the crucibles due to the upward movement of the crucibles, the screen needs an upper portion thereof with a smaller inner diameter. The screen structure consequently has fault such that it is difficult to cool the single crystal. Meanwhile, an inert gas is allowed to flow from a gas inlet 18 and discharged from a gas outlet 19 during single crystal pulling to prevent contamination due to an oxidizing gas. In this event, such a screen structure also has a problem that the cooling effect on the single crystal by the inert gas cannot be expected.

In view of this, there is proposed a structure including: a gas flow-guide cylinder for guiding an inert gas; and a heat-shielding ring for shielding the direct radiation from a heater and a raw-material melt to the gas flow-guide cylinder (Patent document 3). In this method, the cooling effect of the inert gas on the single crystal can be expected. However, considering the radiant heat from the single crystal is absorbed into a cooling chamber, it cannot be said that the cooling capacity is high.

As a method for solving the problems of the screen structure and the gas flow-guide cylinder to achieve efficient cooling, there is proposed a method of providing a water-cooled cooling cylinder around the crystal (Patent document 4). In this method, an outside of the cooling cylinder is protected by a cooling-cylinder-protection member such as a protection cover made of graphite or the like, and thereby the heat of the single crystal can be efficiently removed from the inside of the cooling cylinder. However, since the cooling cylinder does not extend to near the melt surface for safety, the cooling effect on the single crystal is somewhat low in a portion not covered by the cooling cylinder.

Moreover, Patent document 5 discloses a method in which a graphite member etc. fitted in a cooling cylinder is extended. However, this method cannot exert a sufficient cooling effect because the cooling cylinder and the extending graphite member are exposed to the heat from the outside. Besides, the contact between the cooling cylinder and the graphite member is difficult. Consequently, the heat cannot be efficiently conducted from the graphite member to the cooling cylinder.

To solve this problem, Patent Document 6 discloses a method employing an auxiliary cooling cylinder 217 fitted in a cooling cylinder 15 as shown in FIG. 7. Heat generated from the crystal is conducted to the cooling cylinder 15 through the auxiliary cooling cylinder 217, and a coolant is supplied from a coolant inlet 16 to the cooling cylinder 15, so that the heat generated from the crystal is discarded. This method makes it possible to improve the crystal pulling rate.

CITATION LIST

Patent Literature

Patent Document 1: JP H11-157996 A
Patent Document 2: JP S57-40119 B2
Patent Document 3: JP H01-65086 A
Patent Document 4: WO 01/57293 A1
Patent Document 5: JP H06-199590 A
Patent Document 6: JP 2009-161416 A
Patent Document 7: JP 2013-193897 A

SUMMARY OF INVENTION

Technical Problem

The auxiliary cooling cylinder 217 in FIG. 7 is structured such that the auxiliary cooling cylinder 217 is in contact with only the inner surface of the cooling cylinder 15 surrounding the single crystal 7, and is not in contact with the bottom surface of the cooling cylinder 15 facing the raw-material melt 6. As described above, radiant heat from the single crystal 7 may be absorbed into a forcibly-cooled object such as chamber to improve the crystal pulling rate. Furthermore, removing radiant heat from high-temperature portions such as the heater 11 is also effective to improve the crystal pulling rate.

Thus, there is room for further improvement of the single-crystal pulling rate by employing an auxiliary cooling cylinder that is also in contact with the bottom surface of the cooling cylinder facing a raw-material melt. The auxiliary cooling cylinder not only conducts the radiant heat from the single crystal to the cooling cylinder, but also efficiently conducts the radiant heat from high-temperature portions such as the heater to the cooling cylinder, thereby increasing the temperature gradient in the crystal.

Patent Document 7 shows, in FIG. 2, a structure in which the bottom surface of the cooling cylinder facing the raw-material melt is covered with a heat insulating material. However, the heat insulating material is a material having low heat conductivity. There is no prospect of further improvement in the single-crystal pulling rate owing to efficiently conducting radiant heat from the single crystal, heater, etc. to the cooling cylinder, which is a problem.

The present invention has been made in view of the above-described problems. An object of the present invention is to provide an apparatus for manufacturing a single crystal enabling significant improvement of the single-crystal pulling rate by increasing the temperature gradient in the crystal, the apparatus including an auxiliary cooling cylinder having a structure for realizing contact not only with an inner surface of a cooling cylinder surrounding a single crystal but also with a bottom surface of the cooling cylinder facing a raw-material melt, so that the auxiliary cooling cylinder conducts radiant heat from the single crystal to the cooling cylinder, and also efficiently conducts radiant heat from high-temperature portions such as a heater to the cooling cylinder, thereby increasing the temperature gradient in the crystal.

Solution to Problem

The present invention has been made to achieve the object and provides an apparatus for manufacturing a single crystal by growing a single crystal according to a Czochralski method, the apparatus comprising:
 a main chamber configured to house
  a crucible configured to accommodate a raw-material melt, and
  a heater configured to heat the raw-material melt;
 a pulling chamber continuously provided at an upper portion of the main chamber and configured to accommodate a single crystal grown and pulled;
 a cooling cylinder extending from at least a ceiling portion of the main chamber toward the raw-material melt so as to surround the single crystal being pulled, the cooling cylinder being configured to be forcibly cooled with a coolant; and
 an auxiliary cooling cylinder fitted in an inside of the cooling cylinder, wherein
  the auxiliary cooling cylinder comprises any one or more materials of graphite, carbon composite, stainless steel, molybdenum, and tungsten,
  the auxiliary cooling cylinder comprises a structure covering a bottom surface of the cooling cylinder facing the raw-material melt, and a gap between the auxiliary cooling cylinder and the bottom surface of the cooling cylinder is 1.0 mm or less.

With such an apparatus for manufacturing a single crystal, the portion of the auxiliary cooling cylinder covering the bottom surface of the cooling cylinder receives a larger amount of radiant heat from high-temperature portions such as the heater. Besides, the portion of the auxiliary cooling cylinder covering the bottom surface of the cooling cylinder has higher temperature, too. Thereby, the auxiliary cooling cylinder thermally expands and the gap between the auxiliary cooling cylinder and the bottom surface of the cooling cylinder can be reduced, and, as a result, heat conduction to the cooling cylinder is facilitated. Moreover, since the temperature of the portion of the auxiliary cooling cylinder covering the bottom surface of the cooling cylinder is increased by receiving a larger amount of the radiant heat from the raw-material melt and the heater, this increases the amount of radiant heat emitted from the auxiliary cooling cylinder itself to the bottom surface of the cooling cylinder. Accordingly, even when there is a space of 1.0 mm or less between the auxiliary cooling cylinder and the bottom surface of the cooling cylinder, the heat is successfully conducted to the cooling cylinder. Thus, the radiant heat from the single crystal is conducted to the cooling cylinder, and the radiant heat from the high-temperature portions such as the heater is also efficiently conducted to the cooling cylinder, thereby increasing the temperature gradient in the crystal, and making it possible to further improve the single-crystal pulling rate.

In this case, the auxiliary cooling cylinder can cover at least 50% or more of a total area of the bottom surface of the cooling cylinder.

This not only increases the amount of the radiant heat received from the high-temperature portions such as the heater, but also further increases the temperature at the portion of the auxiliary cooling cylinder covering the bottom surface of the cooling cylinder. Thereby, the portion is thermally expanded and the gap between the auxiliary cooling cylinder and the bottom surface of the cooling cylinder can be reduced, further facilitating the heat conduction to the cooling cylinder, further increasing the temperature gradient in the crystal, and enabling furthermore improvement in the single-crystal pulling rate.

The auxiliary cooling cylinder preferably comprises a cover as the structure covering the bottom surface of the cooling cylinder facing the raw-material melt, the cover protruding from the inside toward outside of the cooling cylinder and covering the bottom surface of the cooling cylinder.

Such a cover becomes the portion having higher temperature by receiving a large amount of radiant heat from the raw-material melt and the heater than the portion of the auxiliary cooling cylinder covering the inside of the cooling cylinder. Hence, even when there is a gap at the time of room temperature, the cover of the auxiliary cooling cylinder covering the bottom surface of the cooling cylinder thermally expands as the temperature increases during the single crystal production, so that the gap between the auxiliary cooling cylinder and the bottom surface of the cooling cylinder can be reduced, facilitating heat conduction to the cooling cylinder. Moreover, since the temperature of the cover of the auxiliary cooling cylinder covering the bottom surface of the cooling cylinder is increased by receiving a large amount of the radiant heat from the raw-material melt and the heater, radiant heat emitted from the auxiliary cooling cylinder itself to the bottom surface of the cooling cylinder is increased. Accordingly, even when there is a space of 1.0 mm or less between the auxiliary cooling cylinder and the bottom surface of the cooling cylinder, the heat can be conducted to the cooling cylinder. Thus, the heat is more easily conducted to the cooling cylinder, the temperature gradient in the crystal is further increased, and the single-crystal pulling rate can be improved furthermore.

In this case, more preferably, the apparatus for manufacturing a single crystal further comprises a heat shielding member extending from the ceiling portion of the main chamber and surrounding the bottom surface of the cooling cylinder and the cover of the auxiliary cooling cylinder.

Since this heat shielding member extends from the ceiling portion of the main chamber and surrounds the bottom surface of the cooling cylinder and the cover of the auxiliary cooling cylinder, providing such an heat shielding member makes it possible to further efficiently conduct the radiant heat emitted by the cover of the auxiliary cooling cylinder to the bottom surface of the cooling cylinder.

A gap between the cover of the auxiliary cooling cylinder and the bottom surface of the cooling cylinder can be 0.1 mm or more and 1.0 mm or less.

In the inventive apparatus for manufacturing a single crystal, the temperature of the cover of the auxiliary cooling cylinder covering the bottom surface of the cooling cylinder is increased by receiving a large amount of the radiant heat of the raw-material melt and the heater, and the radiant heat emitted from the auxiliary cooling cylinder itself to the bottom surface of the cooling cylinder is increased. Accordingly, even when there is a space of 0.1 mm or more and 1.0 mm or less between the cover and the bottom surface of the cooling cylinder, it is possible to conduct the heat to the cooling cylinder sufficiently.

Advantageous Effects of Invention

As described above, the inventive apparatus for manufacturing a single crystal includes: the cooling cylinder to be forcibly cooled; and the auxiliary cooling cylinder fitted in the cooling cylinder and made of a particular material. The auxiliary cooling cylinder has a structure covering the bottom surface of the cooling cylinder facing the raw-material melt. These allow efficient conduction of radiant heat from a single crystal and high-temperature portions such as the heater to the cooling cylinder. Thus, it is possible to increase the temperature gradient in the single crystal during the growth, and increase the growth rate of the single crystal.

DESCRIPTION OF EMBODIMENTS

Hereinafter, embodiments of the present invention will be described, but the present invention is not limited thereto.

As noted above, in single crystal manufacturing according to CZ method, increasing the growth rate of a single crystal is one major approach for productivity improvement and cost reduction. It has been known that the single-crystal growth rate can be increased by efficiently removing radiant heat from the single crystal and radiant heat from high-temperature portions such as the heater, and by increasing the temperature gradient in the crystal.

To address this issue, a technique as in Patent Document 6 has been developed in which an auxiliary cooling cylinder is fitted inside a cooling cylinder which is forcibly cooled with a coolant, and which extends from a ceiling portion of a main chamber toward a raw-material melt so as to surround a single crystal being pulled; thereby, heat absorbed from growing single crystal is efficiently transferred from the fitted portion to the cooling cylinder, and the growing single crystal is efficiently cooled to increase the single-crystal growth rate.

However, in the technique disclosed in Patent Document 6, the bottom surface of the cooling cylinder facing the raw-material melt is not covered with the auxiliary cooling cylinder. As described above, in order to achieve high single-crystal growth rate, efficiently removing radiant heat from high-temperature portions such as a heater is also important, besides efficiently removing radiant heat from a single crystal.

The present inventors have earnestly studied the above object and consequently arrived at an apparatus for manufacturing a single crystal by growing a single crystal according to a Czochralski method, the apparatus comprising:
　a main chamber configured to house
　　a crucible configured to accommodate a raw-material melt, and
　　a heater configured to heat the raw-material melt;
　a pulling chamber continuously provided at an upper portion of the main chamber and configured to accommodate a single crystal grown and pulled;
　a cooling cylinder extending from at least a ceiling portion of the main chamber toward the raw-material melt so as to surround the single crystal being pulled, the cooling cylinder being configured to be forcibly cooled with a coolant; and
　an auxiliary cooling cylinder fitted in an inside of the cooling cylinder, wherein
　the auxiliary cooling cylinder comprises any one or more materials of graphite, carbon composite, stainless steel, molybdenum, and tungsten,
　the auxiliary cooling cylinder comprises a structure covering a bottom surface of the cooling cylinder facing the raw-material melt, and
　a gap between the auxiliary cooling cylinder and the bottom surface of the cooling cylinder is 1.0 mm or less. This apparatus for manufacturing a single crystal achieves significantly high single-crystal growth rate by efficiently removing not only radiant heat from a single crystal but also radiant heat from high-temperature portions such as the heater. Thus, the present invention has been completed.

An example of the inventive apparatus for manufacturing a single crystal will be described with reference to FIG. 1. Note that the descriptions of the same features as in the conventional apparatus are omitted as appropriate. An apparatus 1 for manufacturing a single crystal according to the present invention includes: a main chamber 2 configured to house a quartz crucible 4 and a graphite crucible 5 configured to accommodate a raw-material melt 6, and a heater 11 configured to heat the raw-material melt 6; a pulling chamber 3 continuously provided at an upper portion of the main chamber 2 and configured to accommodate a single crystal grown and pulled; a cooling cylinder 15 extending from at least a ceiling portion of the main chamber 2 toward the raw-material melt 6 so as to surround the single crystal being pulled, the cooling cylinder 15 being configured to be forcibly cooled with a coolant; and an auxiliary cooling cylinder 17 fitted in an inside of the cooling cylinder 15. The auxiliary cooling cylinder 17 of the apparatus 1 for manufacturing a single crystal has a structure covering the bottom surface of the cooling cylinder 15 facing the raw-material melt 6, and this structure is a cover 30. FIG. 2 shows an exemplary enlarged view of portions around the cooling cylinder 15 in the inventive apparatus 1 for manufacturing a single crystal. There is a gap 20 of 1.0 mm or less between the auxiliary cooling cylinder 17 and the bottom surface of the cooling cylinder 15. This gap 20 is preferably 0 mm (complete contact).

The cover 30 of the auxiliary cooling cylinder 17 protrudes from the inside toward outside of the cooling cylinder 15 to cover the bottom surface of the cooling cylinder 15. In other words, the auxiliary cooling cylinder 17 has the cover 30 protruding from the inside toward outside of the cooling cylinder 15 and thereby covering the bottom surface of the cooling cylinder 15 facing the raw-material melt 6.

Figure 1:
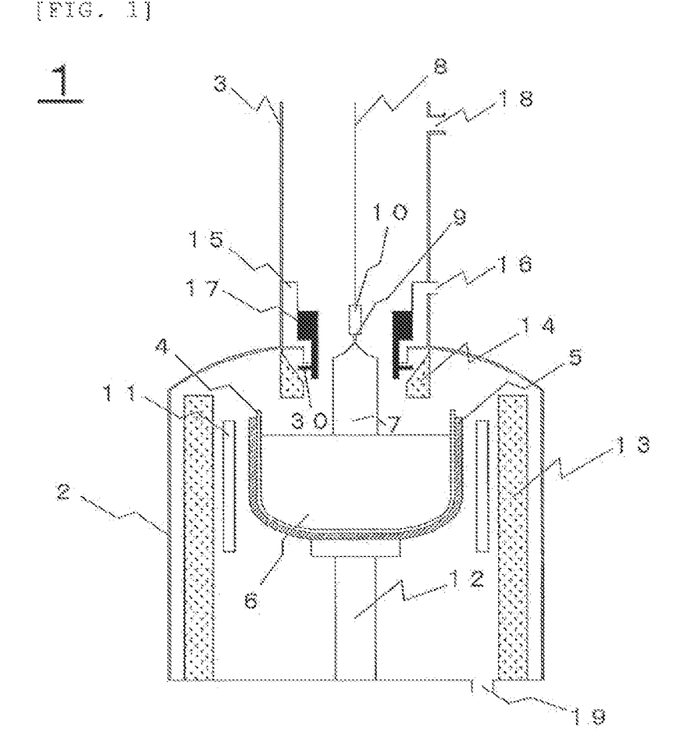
FIG. 1 is a schematic cross-sectional view showing an example of an apparatus for manufacturing a single crystal according to the present invention.
Figure 2:
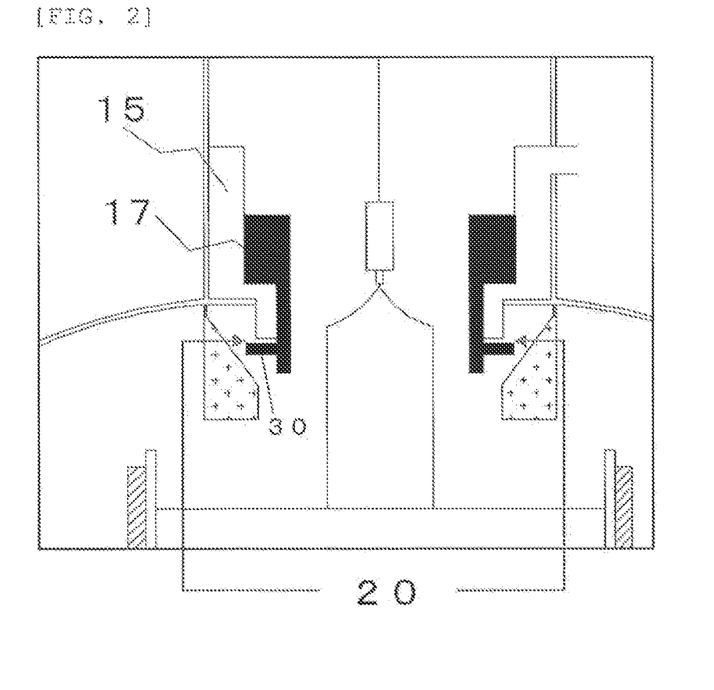
FIG. 2 is a schematic cross-sectional view showing enlarged portions around a cooling cylinder in the example of the inventive apparatus for manufacturing a single crystal shown in FIG. 1.

Additionally, the apparatus 1 for manufacturing a single crystal shown in FIG. 1 further includes a heat shielding member 14 extending from the ceiling portion of the main chamber 2. The heat shielding member 14 surrounds the bottom surface of the cooling cylinder 15 and the cover 30 of the auxiliary cooling cylinder 17.

The material of the auxiliary cooling cylinder according to the present invention is any one or more of graphite, carbon composite, stainless steel, molybdenum, and tungsten, so that radiant heat from the single crystal and high-temperature portions such as the heater can be efficiently absorbed and efficiently transferred to the cooling cylinder. Among these materials, particularly preferable is graphite whose heat conductivity is equivalent to or higher than those of metals, and whose emissivity is higher than those of metals.

Further, the auxiliary cooling cylinder has the structure covering the bottom surface of the cooling cylinder facing the raw-material melt, and the gap between the auxiliary cooling cylinder and the bottom surface of the cooling cylinder is 1.0 mm or less. The reasons are described below.

The temperature of a portion of the auxiliary cooling cylinder covering the bottom surface of the cooling cylinder (the portion corresponding to the cover 30) becomes higher by receiving a large amount of radiant heat of the raw-material melt and the heater, exceeding 1000° C., than a portion of the auxiliary cooling cylinder covering the inside of the cooling cylinder. Hence, despite the presence of the gap at the time of room temperature, the portion of the auxiliary cooling cylinder covering the bottom surface of the cooling cylinder thermally expands as the temperature becomes higher during the single crystal manufacturing. Thereby, the gap between the auxiliary cooling cylinder and the bottom surface of the cooling cylinder can be reduced, facilitating heat conduction to the cooling cylinder. Moreover, since the temperature of the portion of the auxiliary cooling cylinder covering the bottom surface of the cooling cylinder becomes higher by receiving a large amount of the radiant heat of the raw-material melt and the heater, exceeding 1000° C., this increases radiant heat emitted from the auxiliary cooling cylinder itself to the bottom surface of the cooling cylinder. Accordingly, even when there is a space of 1.0 mm or less between the auxiliary cooling cylinder and the bottom surface of the cooling cylinder, the heat can be transferred to the cooling cylinder. Further, as will be described later, the present inventors have found that high single-crystal growth rate can be achieved by setting the gap to 1.0 mm or less. Thus, in order to achieve high single-crystal growth rate, the gap between the bottom surface of the cooling cylinder and the auxiliary cooling cylinder needs to be 1.0 mm or less. With the gap of 1.0 mm or less, the radiant heat from the single crystal and the high-temperature portions such as the heater can be sufficiently conducted to the cooling cylinder owing to the degrees of the radiant heat and thermally expansion at the portion of the auxiliary cooling cylinder which covers the bottom surface of the cooling cylinder facing the raw-material melt. This gap is preferably 0 mm, or may be 0.1 mm or more and 1.0 mm or less.

The auxiliary cooling cylinder made of the above-described material(s) and having the above-described structure is capable of efficiently conducting the radiant heat from the single crystal and the high-temperature portions such as the heater to the cooling cylinder. This makes it possible to increase the temperature gradient inside the single crystal during growth and increase the growth rate of the single crystal.

Moreover, the auxiliary cooling cylinder may cover at least 50% or more of a total area of the bottom surface of the cooling cylinder.

The larger the area of the portion of the auxiliary cooling cylinder covering the bottom surface of the cooling cylinder, the larger the amount of radiant heat transferred from the single crystal and the high-temperature portions such as the heater to the bottom surface of the cooling cylinder. When the area of the portion of the auxiliary cooling cylinder covering the bottom surface of the cooling cylinder is 50% or more of the total area of the cooling-cylinder bottom surface, this not only increases the amount of the radiant heat from the high-temperature portions such as the heater, but also further increases the temperature of the portion of the auxiliary cooling cylinder covering the bottom surface of the cooling cylinder. Thereby, this portion thermally expands and can reduce the gap between the auxiliary cooling cylinder and the bottom surface of the cooling cylinder, facilitating heat conduction to the cooling cylinder. Moreover, since the temperature of the portion of the auxiliary cooling cylinder covering the bottom surface of the cooling cylinder is increased by receiving a large amount of the radiant heat of the raw-material melt and the heater, this increases the radiant heat emitted from the auxiliary cooling cylinder itself to the bottom surface of the cooling cylinder.

Hence, even when there is some gap between the auxiliary cooling cylinder and the bottom surface of the cooling cylinder, more heat can be transferred to the cooling cylinder. It is a matter of course that the auxiliary cooling cylinder preferably covers 100% of the bottom surface of the cooling cylinder. As shown in FIGS. 1 and 2, the cover 30 may extend outwardly beyond the outer diameter of the bottom surface of the cooling cylinder.

As has been described above, the inventive apparatus for manufacturing a single crystal includes: the cooling cylinder to be forcibly cooled; and the auxiliary cooling cylinder made of a particular material and fitted in the cooling cylinder. Moreover, the auxiliary cooling cylinder has such a structure that covers the bottom surface of the cooling cylinder facing the raw-material melt. Thus, the inventive apparatus for manufacturing a single crystal is capable of efficiently conducting radiant heat from the single crystal and the high-temperature portions such as the heater to the cooling cylinder. Accordingly, it is possible to increase the temperature gradient in the single crystal during the growth, and increase the single-crystal growth rate.

Note that when a single crystal is actually manufactured using the inventive apparatus for manufacturing a single crystal, the single crystal may be manufactured while, for example, applying magnetic field to the raw-material melt depending on the requirements and so forth of the single crystal to be manufactured.

EXAMPLE

Hereinafter, the present invention will be described in detail with reference to Examples. However, the present invention is not limited thereto.

In Examples 1 to 3 and Comparative Example, an apparatus for manufacturing a single crystal to be described below was used to manufacture silicon single crystals which were 300 mm in diameter by magnetic field applied Czochralski method (MCZ method). In these events, the quartz crucible 4 had a diameter of 800 mm.

Example 1

The apparatus 1 for manufacturing a single crystal as shown in FIG. 1 was used to manufacture single crystals. The auxiliary cooling cylinder 17 used had a structure covering the bottom surface of the cooling cylinder 15 facing the raw-material melt 6. Six levels of 0 mm (complete contact), 0.1 mm, 0.2 mm, 0.5 mm, 0.8 mm, and 1.0 mm were designed as the gap 20 shown in FIG. 2 between the bottom surface of the cooling cylinder 15 facing the raw-material melt 6 and the upper surface of the cover 30 of the auxiliary cooling cylinder 17, which is the structure covering the bottom surface of the cooling cylinder 15 facing the raw-material melt 6. The bottom surface of the cooling cylinder 15 facing the raw-material melt 6 was covered with the cover 30 of the auxiliary cooling cylinder 17 such that the covered area accounted for 100% of the bottom surface of the cooling cylinder 15 facing the raw-material melt 6. Note that graphite having a heat conductivity equivalent to or higher than metals and an emissivity higher than metals was used as the material of the auxiliary cooling cylinder 17.

Such an apparatus 1 for manufacturing a single crystal was used to grow the single crystals 7 to find a growth rate at which all the single crystals were defect-free. Since the margin of the growth rate to obtain defect-free crystals is quite narrow, the appropriate growth rate is easily determined. In the evaluation of whether or not the single crystals had defect, each of the prepared single crystals was sliced into samples, and whether the crystal was defect-free or not was evaluated by selective etching.

Comparative Example

Single crystals were manufactured by using the same apparatus as the apparatus 1 for manufacturing a single crystal described in Example 1, except that the gap 20 between the bottom surface of the cooling cylinder 15 facing the raw-material melt 6 and the upper surface of the cover 30 of the auxiliary cooling cylinder 17, which is the structure covering the bottom surface of the cooling cylinder 15 facing the raw-material melt 6, was changed to three levels of 1.1 mm, 1.2 mm, and 1.5 mm. Regarding the other conditions, the single crystals were manufactured under the same conditions described in Example 1.

Figure 3:
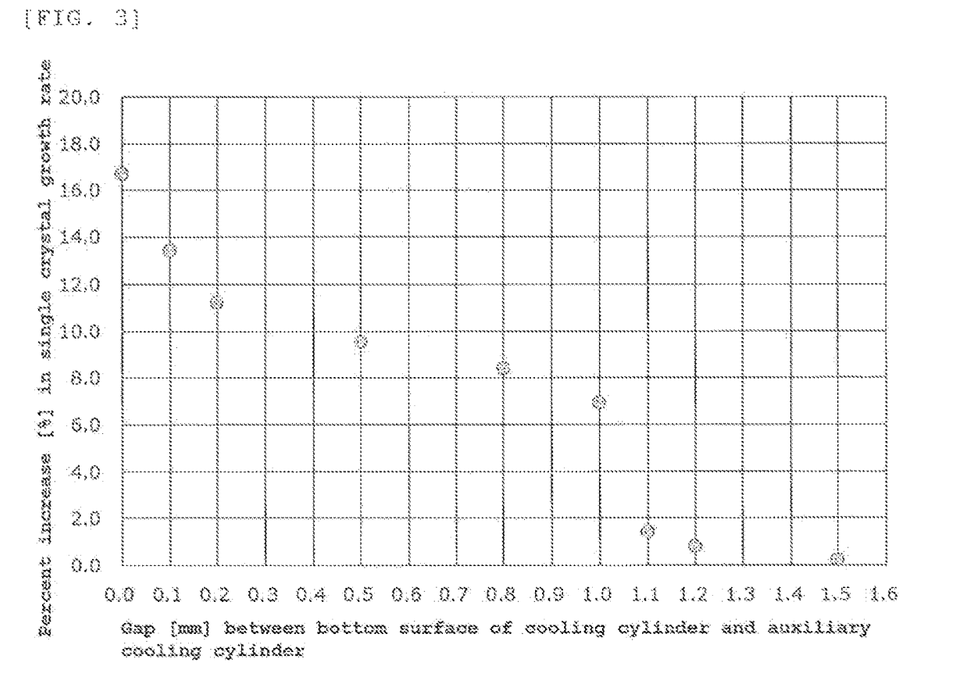
FIG. 3 is a graph showing the percent increase in single crystal growth rate relative to the gap between a bottom surface of a cooling cylinder and an auxiliary cooling cylinder in Example 1 and Comparative Example.

FIG. 3 shows the results of Example 1 and Comparative Example. In Example 1 using the inventive apparatus for manufacturing a single crystal, when the gap between the bottom surface of the cooling cylinder and the auxiliary cooling cylinder was 0 mm (complete contact), a percent increase in growth rate by approximately 16.7% was achieved in comparison with the case of using the conventional apparatus for manufacturing a single crystal as shown in FIG. 7 which includes the auxiliary cooling cylinder having no structure covering the bottom surface of the cooling cylinder facing the raw-material melt. Moreover, as can be seen from FIG. 3, it was found that with gaps of 1.0 mm or less between the bottom surface of the cooling cylinder and the auxiliary cooling cylinder, covering the bottom surface of the cooling cylinder with the auxiliary cooling cylinder enabled significant increase in the single-crystal growth rate. In contrast, when the gap between the bottom surface of the cooling cylinder and the auxiliary cooling cylinder was 1.1 mm or more in the apparatus for manufacturing a single crystal used in Comparative Example, radiant heat was not able to be efficiently removed from the single crystal; besides, radiant heat was not able to be efficiently removed from the high-temperature portions such as the heater. It can be seen that when the gap was 1.1 mm also, the percent increase was approximately 1.4%, and significant increase in the single-crystal growth rate was not achieved in comparison with the conventional apparatus for manufacturing a single crystal.

As described above, the inventive apparatus for manufacturing a single crystal is capable of efficiently removing the radiant heat not only from the single crystal but also from the high-temperature portions such as the heater, and successfully achieves significant increase in the single-crystal growth rate. In addition, setting the gap of 1.0 mm or less between the bottom surface of the cooling cylinder and the auxiliary cooling cylinder can contribute to higher single-crystal growth rate.

Example 2

Figure 4:
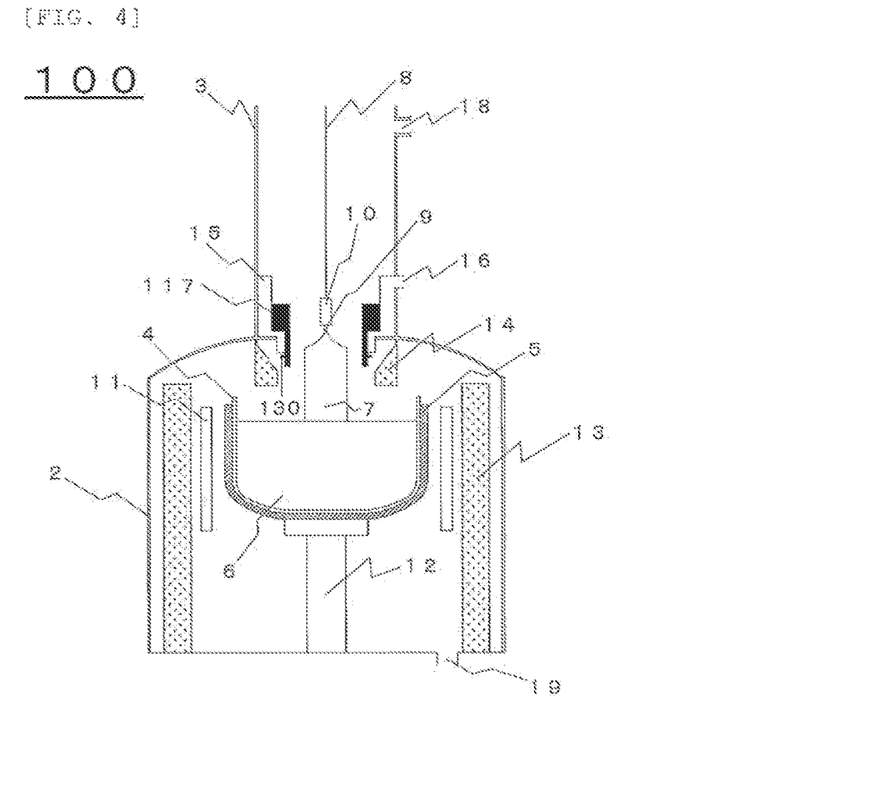
FIG. 4 is a schematic cross-sectional view showing an example of a different embodiment of the inventive apparatus for manufacturing a single crystal.
Figure 5:
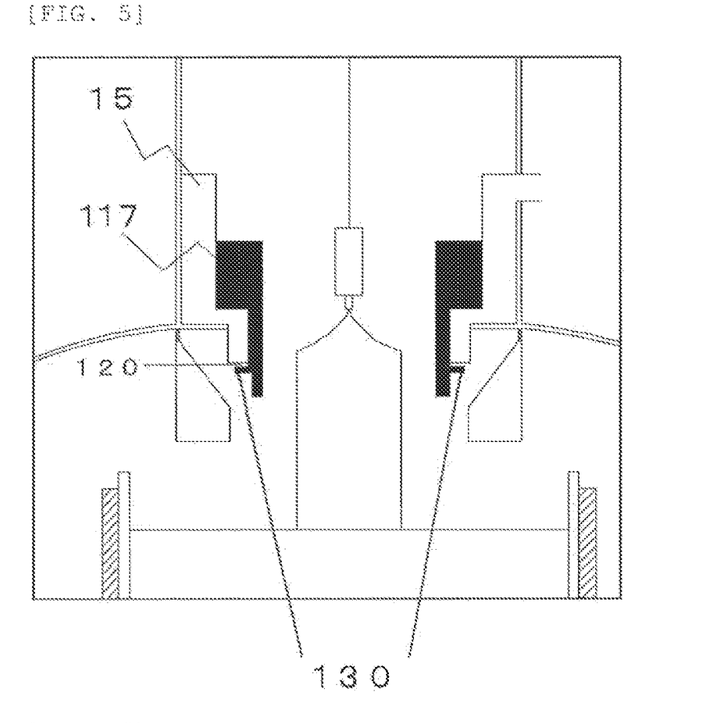
FIG. 5 is a schematic cross-sectional view showing enlarged portions around a cooling cylinder in the example of the different embodiment of the inventive apparatus for manufacturing a single crystal shown in FIG. 4.

Single crystals were manufactured using an apparatus 100 for manufacturing a single crystal as shown in FIG. 4, which is a different embodiment from Example 1. In this event, an area of the bottom surface of the cooling cylinder 15 facing the raw-material melt 6 was covered with a cover 130 of an auxiliary cooling cylinder 117 as shown in FIG. 5, and the coverage was designed at nine levels of 100%, 90%, 80%, 70%, 60%, 50%, 40%, 30%, and 20% in the bottom surface of the cooling cylinder facing the raw-material melt 6. Besides this, the single crystals 7 were manufactured under the same manufacturing conditions as in Example 1, and evaluated as in Example 1. Note that, in this event, a gap 120 was 0.1 mm between the bottom surface of the cooling cylinder 15 facing the raw-material melt 6 and the upper surface of the cover 130 of the auxiliary cooling cylinder 117, which is the structure covering the bottom surface of the cooling cylinder 15 facing the raw-material melt 6.

Figure 6:
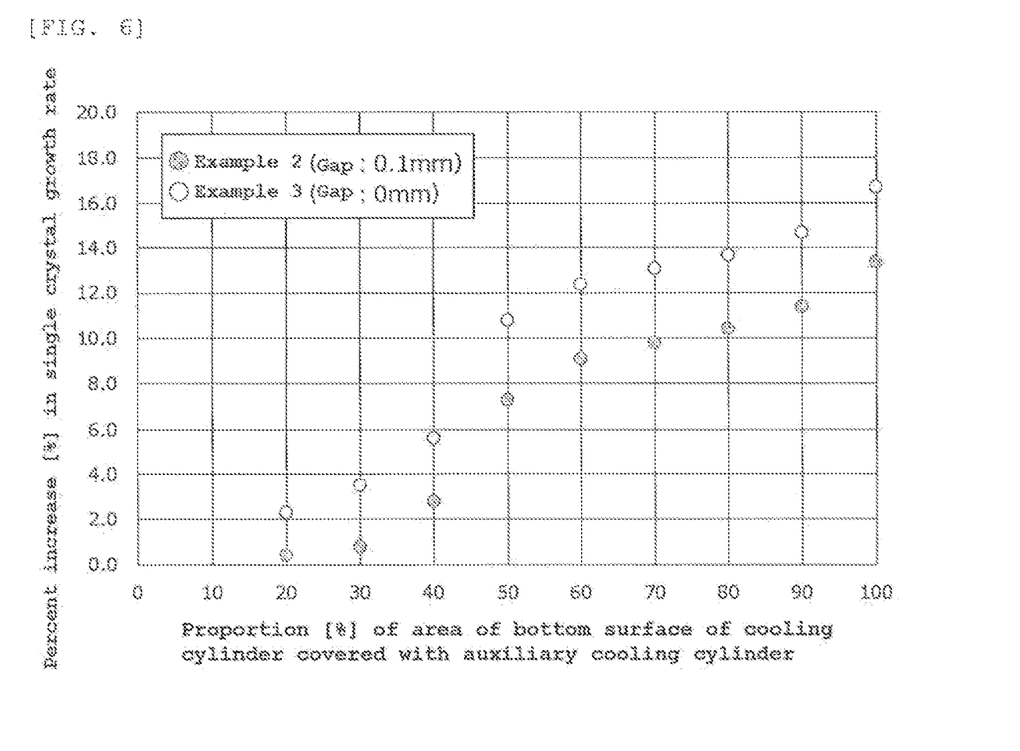
FIG. 6 is a graph showing the percent increase in single crystal growth rate relative to the proportion of the area of the cooling-cylinder bottom surface covered with the auxiliary cooling cylinder in Examples 2 and 3. In the graph, the result of Example 2 was plotted using hatched circles, and the result of Example 3 was plotted using white circles.

FIG. 6 shows the result of Example 2. As can be seen from FIG. 6, it was found out that when 50% or more of the total area of the bottom surface of the cooling cylinder was covered with the auxiliary cooling cylinder, covering the bottom surface of the cooling cylinder with the auxiliary cooling cylinder made it possible to significantly increase the single-crystal growth rate in comparison with the case of using the conventional apparatus for manufacturing a single crystal as shown in FIG. 7, which includes the auxiliary cooling cylinder having no structure covering the bottom surface of the cooling cylinder facing the raw-material melt. Note that when 100% of the area of the cooling-cylinder bottom surface was covered with the auxiliary cooling cylinder, a percent increase in growth rate by approximately 13.4% was achieved.

As described above, the following were found from the inventive apparatus for manufacturing a single crystal: the larger the area of the cooling-cylinder bottom surface which faces the raw-material melt, and which is covered with the auxiliary cooling cylinder, the larger the heat amount transferred to the cooling cylinder; in addition, the inventive apparatus for manufacturing a single crystal is capable of removing larger amounts of the radiant heat not only from the single crystal but also from the high-temperature portions such as the heater, and successfully achieves further increase in the single-crystal growth rate.

Example 3

Crystals were manufactured using the same apparatus for manufacturing a single crystal described in Example 2 such that when an area of the bottom surface of the cooling cylinder facing the raw-material melt was covered with the cover of the auxiliary cooling cylinder, the coverage was designed at nine levels of 100%, 90%, 80%, 70%, 60%, 50%, 40%, 30%, and 20% in the bottom surface of the cooling cylinder facing the raw-material melt as in Example 2. Nevertheless, as a different embodiment from Example 2, the gap was 0 mm (complete contact) between the bottom surface of the cooling cylinder facing the raw-material melt and the upper surface of the cover of the auxiliary cooling cylinder, which is the structure covering the bottom surface of the cooling cylinder facing the raw-material melt.

FIG. 6 shows the result of Example 3. In comparison with Example 2, in which the gap was 0.1 mm between the bottom surface of the cooling cylinder facing the raw-material melt and the upper surface of the cover of the auxiliary cooling cylinder, which is the structure covering the bottom surface of the cooling cylinder facing the raw-material melt, the percent increase in growth rate in Example 3 was high because the complete contact was achieved by the upper surface of the cover of the auxiliary cooling cylinder, which is the structure covering the bottom surface of the cooling cylinder facing the raw-material melt. Moreover, even when the bottom surface of the cooling cylinder facing the raw-material melt was covered with the cover of the auxiliary cooling cylinder such that the covered area accounted for 40% of the bottom surface of the cooling cylinder facing the raw-material melt, an increase in growth rate by 5.6% was achieved in Example 3, in which the gap was 0 mm (complete contact) between the bottom surface of the cooling cylinder facing the raw-material melt and the upper surface of the cover of the auxiliary cooling cylinder, which is the structure covering the bottom surface of the cooling cylinder facing the raw-material melt. Thus, with the gap of 0 mm (complete contact) between the bottom surface of the cooling cylinder facing the raw-material melt and the upper surface of the cover of the auxiliary cooling cylinder, which is the structure covering the bottom surface of the cooling cylinder facing the raw-material melt, even when the bottom surface of the cooling cylinder facing the raw-material melt is covered with the cover of the auxiliary cooling cylinder such that the covered area accounts for 50% or less of the bottom surface of the cooling cylinder facing the raw-material melt, such coverage can contribute to higher growth rate.

In the inventive apparatus for manufacturing a single crystal as in Example 1 of the present invention, the material of the auxiliary cooling cylinder is a particular material, the auxiliary cooling cylinder has the structure covering the bottom surface of the cooling cylinder facing the raw-material melt, and the gap between the auxiliary cooling cylinder and the bottom surface of the cooling cylinder is 1.0 mm or less. As described above, the inventive apparatus for manufacturing a single crystal was capable of efficiently removing radiant heat not only from the single crystal but also from the high-temperature portions such as the heater, and significantly increased the single-crystal growth rate in comparison with the conventional apparatus for manufacturing a single crystal. In addition, according to Example 2 and Example 3, the auxiliary cooling cylinder more preferably covers at least 50% or more of the total area of the bottom surface of the cooling cylinder facing the raw-material melt.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. An apparatus for manufacturing a single crystal by growing a single crystal according to a Czochralski method, the apparatus comprising:
    a main chamber configured to house
        a crucible configured to accommodate a raw-material melt, and
        a heater configured to heat the raw-material melt;
    a pulling chamber continuously provided at an upper portion of the main chamber and configured to accommodate a single crystal grown and pulled;
    a cooling cylinder extending from at least a ceiling portion of the main chamber toward the raw-material melt so as to surround the single crystal being pulled, the cooling cylinder being configured to be forcibly cooled with a coolant;
    an auxiliary cooling cylinder fitted in an inside of the cooling cylinder, wherein
        the auxiliary cooling cylinder comprises any one or more materials of graphite, carbon composite, stainless steel, molybdenum, and tungsten,
        the auxiliary cooling cylinder comprises a cover covering a bottom surface of the cooling cylinder facing the raw-material melt, the cover protruding from the inside of the cooling cylinder toward an outside of the cooling cylinder and covering the bottom surface of the cooling cylinder, and
        a gap between the cover of the auxiliary cooling cylinder and the bottom surface of the cooling cylinder is 1.0 mm or less; and
    a heat shielding member extending from the ceiling portion of the main chamber and surrounding the bottom surface of the cooling cylinder and the cover of the auxiliary cooling cylinder.

2. The apparatus for manufacturing a single crystal according to claim 1, wherein the auxiliary cooling cylinder covers at least 50% or more of a total area of the bottom surface of the cooling cylinder.

3. The apparatus for manufacturing a single crystal according to claim 1, wherein the gap between the cover of the auxiliary cooling cylinder and the bottom surface of the cooling cylinder is 0.1 mm or more and 1.0 mm or less.

4. The apparatus for manufacturing a single crystal according to claim 2, wherein the gap between the cover of the auxiliary cooling cylinder and the bottom surface of the cooling cylinder is 0.1 mm or more and 1.0 mm or less.

* * * * *